United States Patent
Nagashima et al.

(10) Patent No.: US 8,259,489 B2
(45) Date of Patent: Sep. 4, 2012

(54) NONVOLATILE SEMICONDUCTOR MEMORY DEVICE GENERATING DIFFERENT WRITE PULSES TO VARY RESISTANCES

(75) Inventors: Hiroyuki Nagashima, Yokohama (JP); Hirofumi Inoue, Kamakura (JP); Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 209 days.

(21) Appl. No.: 12/677,017

(22) PCT Filed: Sep. 9, 2008

(86) PCT No.: PCT/JP2008/066613
§ 371 (c)(1),
(2), (4) Date: Mar. 8, 2010

(87) PCT Pub. No.: WO2009/050969
PCT Pub. Date: Apr. 23, 2009

(65) Prior Publication Data
US 2010/0328988 A1 Dec. 30, 2010

(30) Foreign Application Priority Data
Oct. 17, 2007 (JP) ................................ 2007-269770

(51) Int. Cl.
*G11C 11/00* (2006.01)
(52) U.S. Cl. ........................ 365/163; 365/148
(58) Field of Classification Search .............. 365/148 X, 365/163 O, 148, 163
See application file for complete search history.

(56) References Cited

U.S. PATENT DOCUMENTS

| | | | |
|---|---|---|---|
| 6,314,014 B1 * | 11/2001 | Lowrey et al. | 365/100 |
| 6,750,469 B2 | 6/2004 | Ichihara et al. | |
| 6,888,745 B2 * | 5/2005 | Ehiro et al. | 365/158 |
| 7,082,052 B2 * | 7/2006 | Rinerson et al. | 365/171 |
| 8,119,478 B2 | 2/2012 | Jeong et al. | |
| 2002/0131309 A1 | 9/2002 | Nishihara et al. | |
| 2004/0114429 A1 | 6/2004 | Ehiro et al. | |
| 2008/0002455 A1 | 1/2008 | Toda et al. | |

FOREIGN PATENT DOCUMENTS

| | | |
|---|---|---|
| JP | 2002 203392 | 7/2002 |
| JP | 2002 541613 | 12/2002 |
| JP | 2003-100085 | 4/2003 |
| JP | 2004 185756 | 7/2004 |

(Continued)

OTHER PUBLICATIONS

Office Action issued May 26, 2011, in Korean Patent Application No. 10-2010-7008287 with English translation.

(Continued)

*Primary Examiner* — VanThu Nguyen
(74) *Attorney, Agent, or Firm* — Oblon, Spivak, McClelland, Maier & Neustadt, L.L.P.

(57) ABSTRACT

A nonvolatile semiconductor memory device comprises a memory cell array of electrically erasable programmable nonvolatile memory cells arranged in matrix, each memory cell using a variable resistor. A pulse generator is operative to generate plural types of write pulses for varying the resistance of the variable resistor in three or more stages based on ternary or higher write data. A selection circuit is operative to select a write target memory cell from the memory cell array based on a write address and supply the write pulse generated from the pulse generator to the selected memory cell.

17 Claims, 13 Drawing Sheets

FOREIGN PATENT DOCUMENTS

| | | |
|---|---|---|
| JP | 2005 522045 | 7/2005 |
| JP | 2007-184591 | 7/2007 |
| KR | 10-2005-0110680 A | 11/2005 |
| KR | 10-2006-0082510 A | 7/2006 |
| KR | 10-2007-0005823 A | 1/2007 |
| WO | WO 2005/066969 A1 | 7/2005 |
| WO | WO 2006/128896 A1 | 12/2006 |

OTHER PUBLICATIONS

Office Action issued Nov. 16, 2011, in Korean Patent Application No. 10-2010-7008287 with English translation.
Korean Office Action issued May 1, 2012, in Patent Application No. 10-2010-7008287 (with English Translation).
Japanese Office Action issued May 8, 2012, in Patent Application No. 2007-269770 (with English Translation).

* cited by examiner

FIG. 6
(a) Schottky Structure
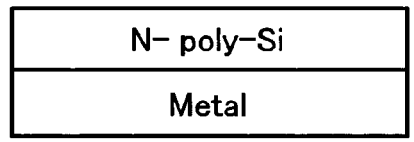
(d) MIM Structure
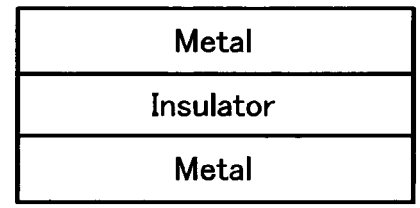
(b) PN Structure
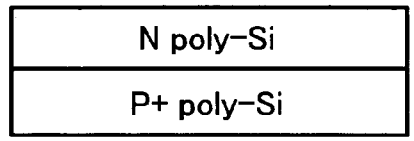
(e) SIS Structure
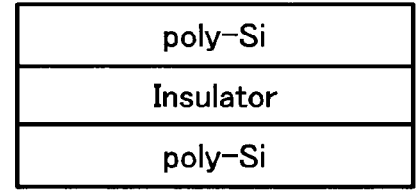
(c) PIN Structure
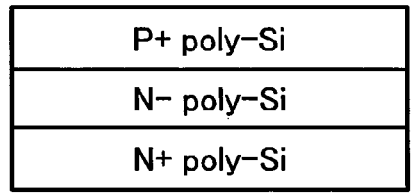

NONVOLATILE SEMICONDUCTOR MEMORY DEVICE GENERATING DIFFERENT WRITE PULSES TO VARY RESISTANCES

TECHNICAL FIELD

The present invention relates to a nonvolatile semiconductor memory device using variable resistors, and more particularly to a nonvolatile semiconductor memory device capable of writing multivalue data at high speeds.

BACKGROUND ART

Electrically erasable programmable nonvolatile memories include a flash memory as well known in the art, which comprises a memory cell array of NAND-connected or NOR-connected memory cells having a floating gate structure. A ferroelectric memory is also known as a nonvolatile fast random access memory.

On the other hand, technologies of pattering memory cells much finer include a resistance variable memory, which uses a variable resistor in a memory cell as proposed (Patent Document 1). The resistance variable memory of such the type utilizes the fact that the resistance ratio of crystal to non-crystal of chalcogenide glass is as large as 100:1 or more, and stores the different resistance states as information. The resistance variable memory may include a serial circuit of a Schottky diode and a variable resistor in place of the transistor to configure a memory cell. Accordingly, it can be easily stacked in layers and three-dimensionally structured to achieve much higher integration as an advantage (Patent Document 2). Each memory cell is, however, just allowed to control two states: a high-resistance state and a low-resistance state.

[Patent Document 1] JP 2002-541613T
[Patent Document 2] JP 2005-522045T

DISCLOSURE OF INVENTION

Technical Problem

The present invention has an object to provide a nonvolatile semiconductor memory device capable of writing multivalue data at high speeds in a nonvolatile semiconductor device using variable resistors.

Technical Solution

In an aspect the present invention provides a nonvolatile semiconductor memory device, comprising: a memory cell array of electrically erasable programmable nonvolatile memory cells arranged in matrix, each memory cell using a variable resistor; a pulse generator operative to generate plural types of write pulses for varying the resistance of the variable resistor in three or more stages based on ternary or higher write data; and a selection circuit operative to select a write target memory cell from the memory cell array based on a write address and supply the write pulse generated from the pulse generator to the selected memory cell.

In another aspect the present invention provides a nonvolatile semiconductor memory device, comprising: a memory cell array formed in plural stacked layers, each layer including a plurality of word lines, a plurality of bit lines crossing the word lines, and memory cells arranged at intersections of the word lines and the bit lines, the memory cells including electrically erasable programmable nonvolatile memory cells arranged in matrix, each memory cell using a variable resistor; a pulse generator operative to generate plural types of write pulses for varying the resistance of the variable resistor in three or more stages based on ternary or higher write data; and a selection circuit operative to select a write target memory cell from the memory cell array based on a write address and supply the write pulse generated from the pulse generator to the selected memory cell.

In yet another aspect the present invention provides a nonvolatile semiconductor memory device, comprising: a memory cell array of electrically erasable programmable nonvolatile memory cells arranged in matrix, each memory cell using a variable resistor; a decoder circuit operative to generate ternary or higher write data to be written in a certain one of the memory cells based on input data to be written in the memory cell array; and a pulse generator operative to generate plural types of write pulses for varying the resistance of the variable resistor in three or more stages based on the write data.

Effect of the Invention

In accordance with the present invention, it is possible to write multivalue data at high speeds in a nonvolatile semiconductor device using variable resistors.

BRIEF DESCRIPTION OF DRAWINGS

FIG. 6 is a schematic cross-sectional view showing a non-ohmic element example in the same embodiment.

BEST MODE FOR CARRYING OUT THE INVENTION

The embodiments of the invention will now be described with reference to the drawings.

Embodiments

[Entire Configuration]

Figure 1:
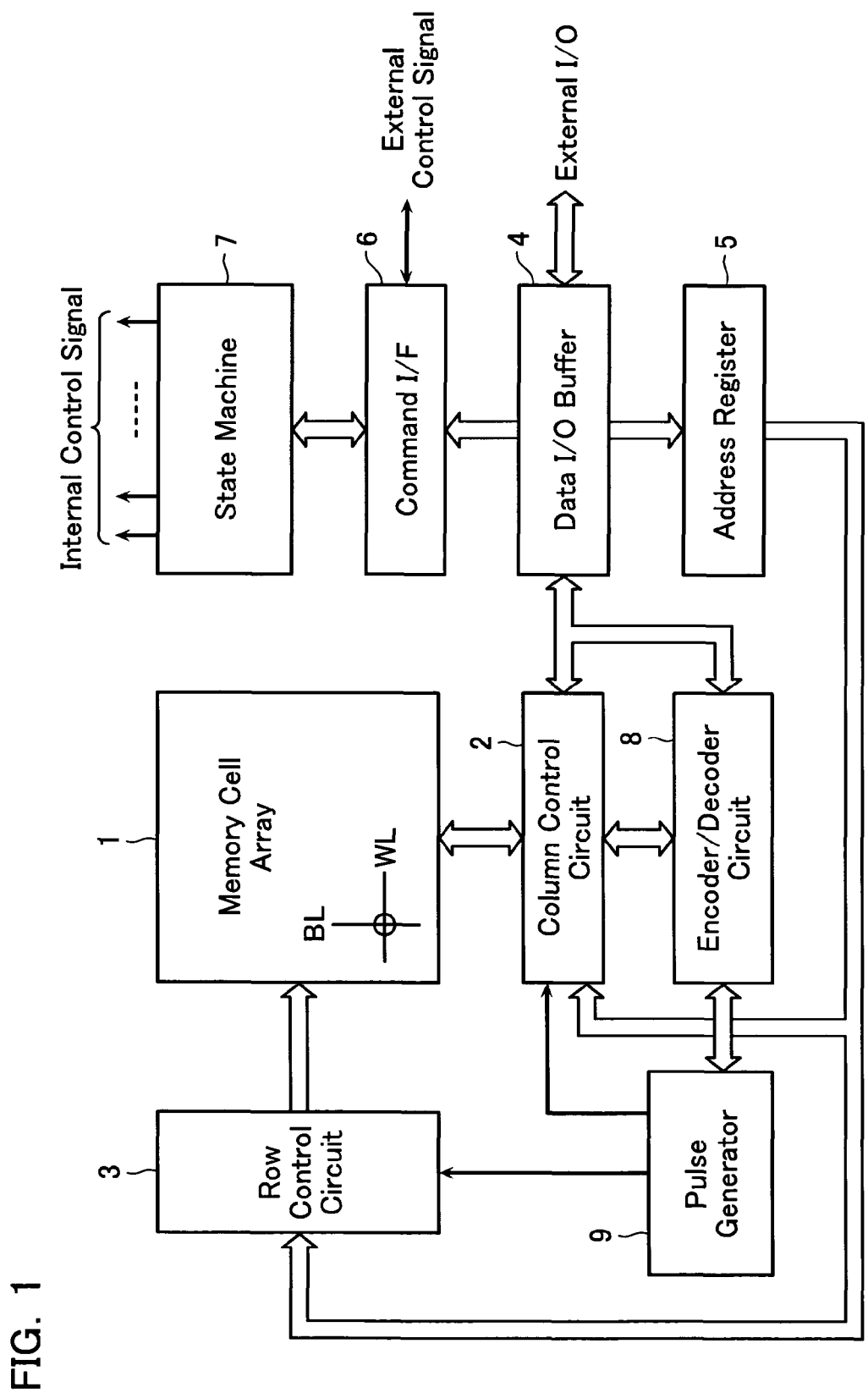
FIG. 1 is a block diagram of a nonvolatile memory according to an embodiment of the present invention.

FIG. 1 is a block diagram of a nonvolatile memory according to an embodiment of the present invention.

The nonvolatile memory comprises a memory cell array 1 of memory cells arranged in matrix, each memory cell including a later-described variable resistor. A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell.

A data I/O buffer 4 is connected to an external host, not shown, via an I/O line to receive write data, receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent to the column control circuit 2 and the row control circuit 3 via an address register 5. A command fed from the host to the data I/O buffer 4 is sent to a command interface 6. The command interface 6 receives an external control signal from the host and decides whether the data fed to the data I/O buffer 4 is write data, a command or an address. If it is a command, then the command interface transfers it as a received command signal to a state machine 7. The state machine 7 manages the entire nonvolatile memory to receive commands from the host, read, write, erase, and execute data I/O management.

The data fed from the host to the data I/O buffer 4 is transferred to an encoder/decoder circuit 8, of which output signal is fed into a pulse generator 9. In accordance with the input signal, the pulse generator 9 provides a write pulse with a certain voltage at a certain timing. The pulse generated at the pulse generator 9 is transferred to any lines selected by the column control circuit 2 and the row control circuit 3.

[Memory Cell Array and Peripheral Circuits]

Figure 2:
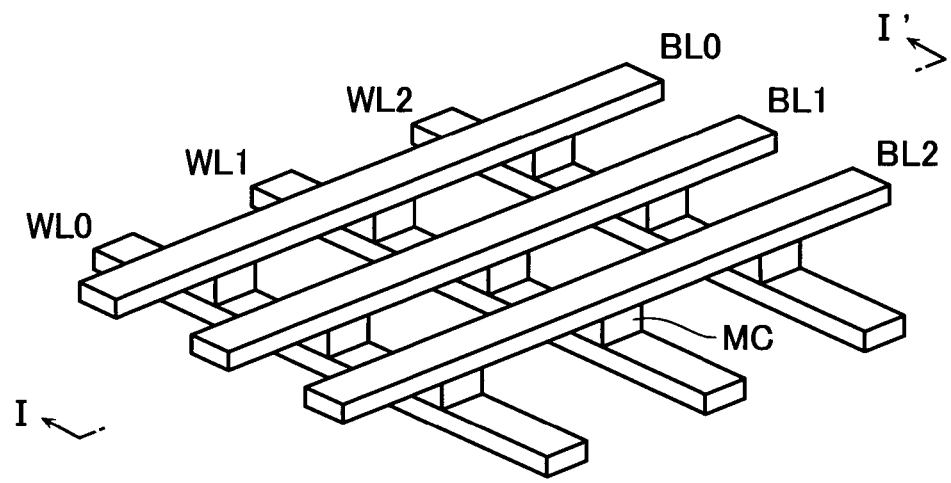
FIG. 2 is a perspective view of part of a memory cell array in the nonvolatile memory according to the same embodiment.
Figure 3:
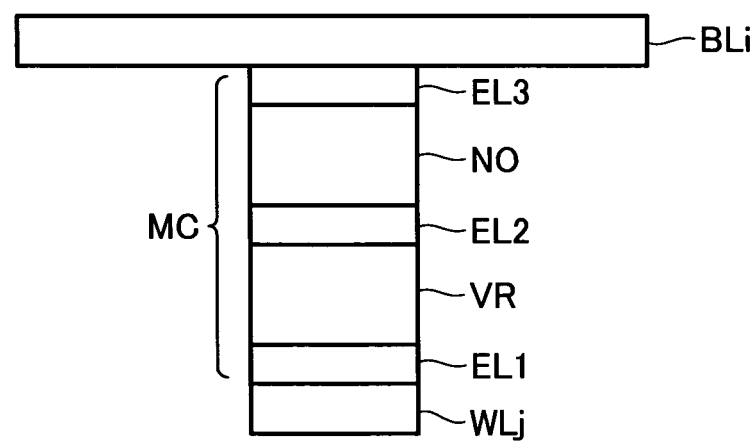
FIG. 3 is a cross-sectional view taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines orbit lines BL0-BL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistor VR and a non-ohmic element NO as shown in FIG. 3.

The variable resistor VR can vary the resistance through current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed.

The variable resistor VR may include one such as chalcogenide that varies the resistance through the phase change between the crystal state and the non-crystal state (PRAM); and one that comprises a composite compound containing cations of a transition element and varies the resistance through migration of cations.

Figure 4:
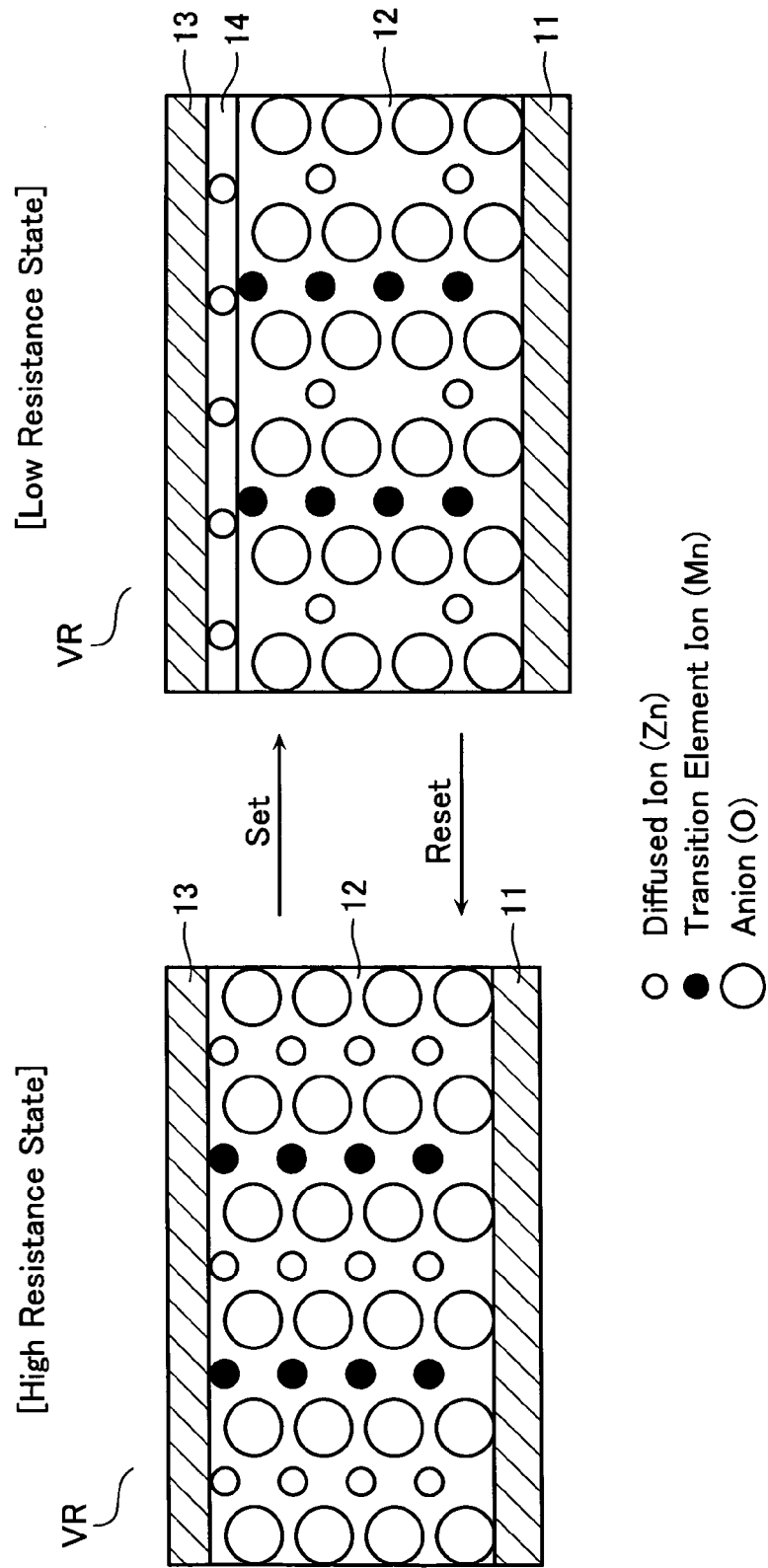
FIG. 4 is a schematic cross-sectional view showing a variable resistor example in the same embodiment.
Figure 5:
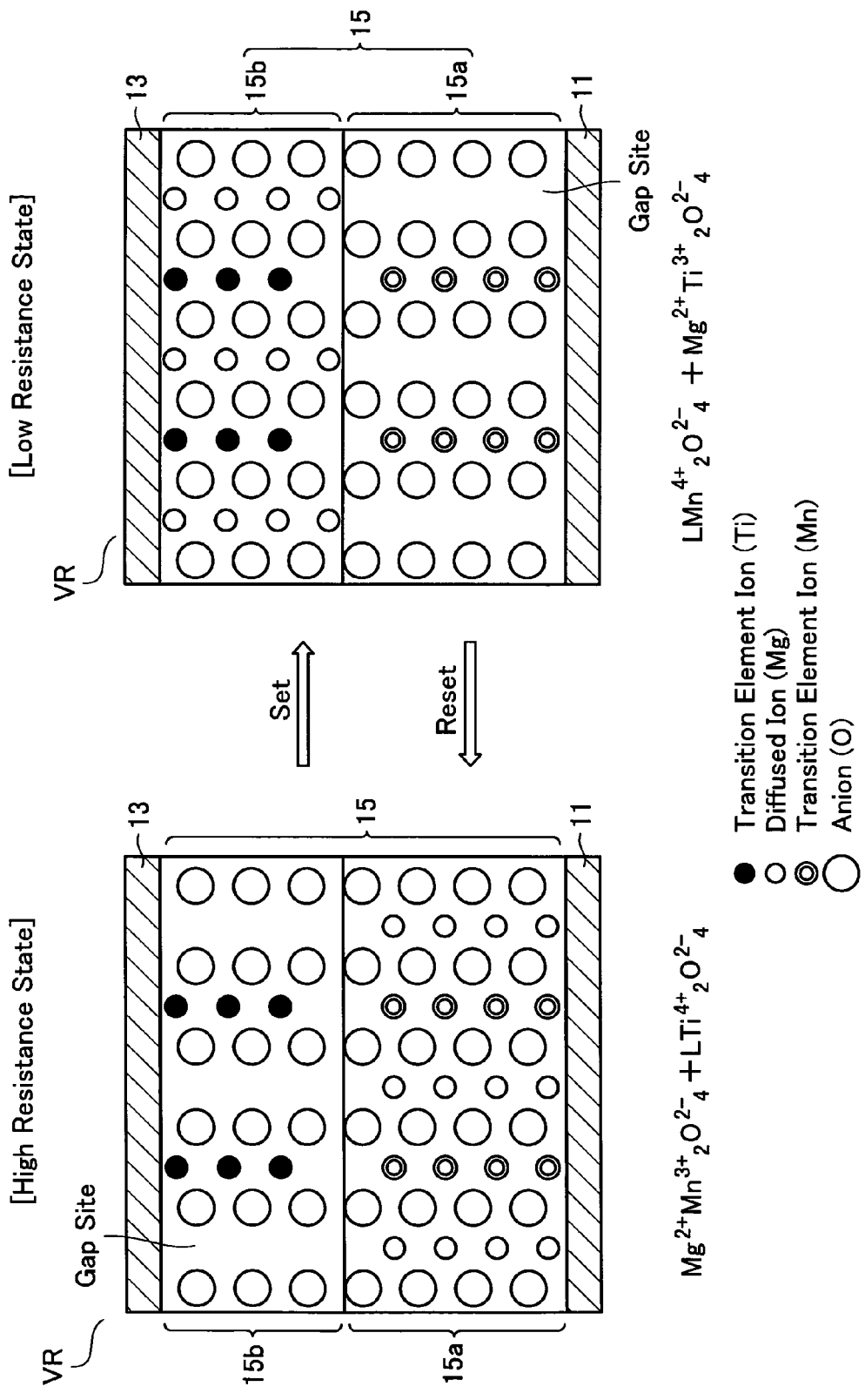
FIG. 5 is a schematic cross-sectional view showing another variable resistor example in the same embodiment.

FIGS. 4 and 5 show an example of the latter variable resistor. The variable resistor VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMU_4$), an olivine structure ($A_2MO_4$), a hollandite structure ($AMO_2$), a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow resetting.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xM1_yX1_z$. The second compound layer 15b is arranged on the side close to the electrode layer 13 and has gap sites capable of accommodating cation elements from the first compound layer 15a.

In the example of FIG. 5, in the first compound layer 15a, A comprises Mg, M1 comprises Mn, and X1 comprises O. The second compound layer 15b contains Ti shown with black circles as transition reduction ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

In such the variable resistor VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes gap sites capable of accommodating diffused ions. Accordingly, the diffused ions moved from the first compound layer 15a are trapped in the gap sites. Therefore, the valence of the transition element ion in the first compound layer 15a increases while the valence of the transition element ion in the second compound layer 15b decreases. In the initial state, the first and second compound layers 15a, 15b may be in the high-resistance state. In such the case, migration of part of diffused ions in the first compound layer 15a therefrom into the second compound layer 15b generates conduction carriers in the crystals of the first and second compounds, and thus both have electric conduction. The programmed state (low-resistance state) may be reset to the erased state (high-resistance state) by supplying a large current flow in the recording layer 15 for a sufficient time for Joule heating to facilitate the oxidation reduction reaction in the recording layer 15, like in the preceding example. Application of an electric field in the opposite direction from that at the time of setting may also allow reset.

The non-ohmic element NO may include various diodes such as (a) a Schottky diode, (b) a PN-junction diode, (c) a PIN diode and may have (d) a MIM (Metal-Insulator-Metal) structure, and (e) a SIS (Silicon-Insulator-Silicon) structure. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation. The non-ohmic element NO and the variable resistor VR may be arranged in the opposite up/down relation from FIG. 3. Alternatively, the non-ohmic element NO may have the up/down-inverted polarity.

Figure 7:
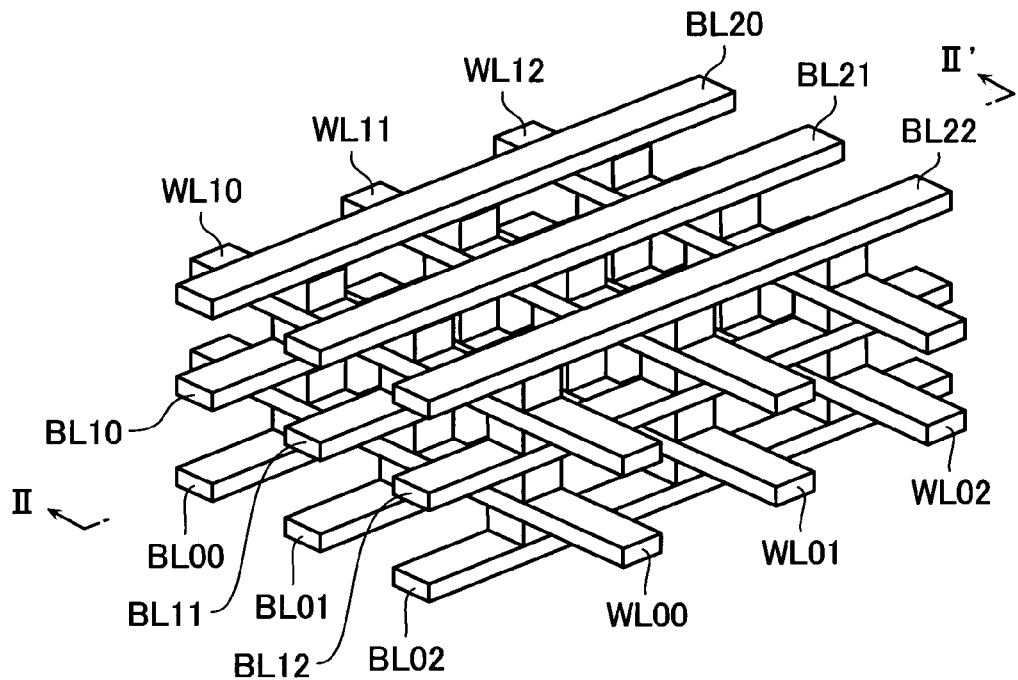
FIG. 7 is a perspective view of part of a memory cell array according to another embodiment of the present invention.
Figure 8:
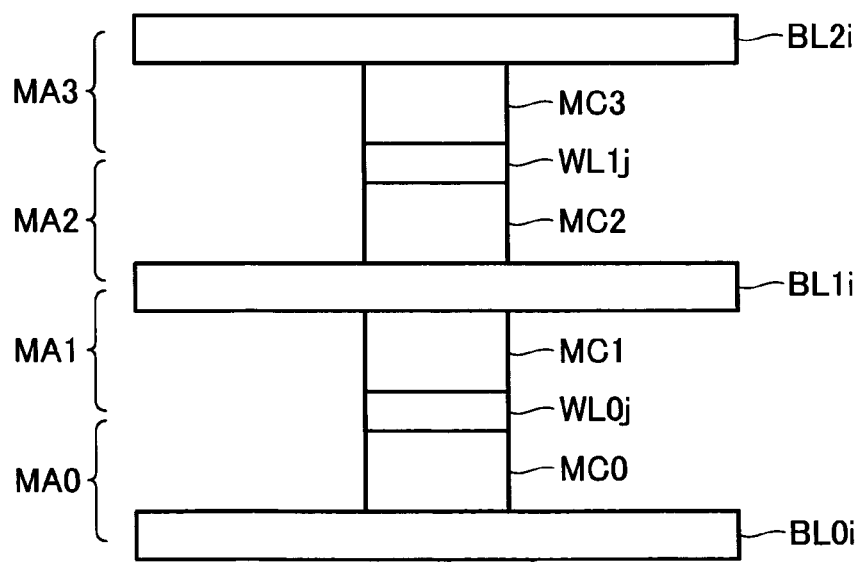
FIG. 8 is a cross-sectional view taken along II-II' line and seen from the direction of the arrow in FIG. 7.

Plural such memory structures described above may be stacked to form a three-dimensional structure as shown in FIG. 7. FIG. 8 is a cross-sectional view showing an II-II' section in FIG. 7. The shown example relates to a memory cell array of a 4-layer structure having cell array layers MA0-MA3. A word line WL0j is shared by an upper and a lower memory cell MC0, MC1. A bit line BL1i is shared by an upper and a lower memory cell MC1, MC2. A word line WL1j is shared by an upper and a lower memory cell MC2, MC3. In place of the line/cell/line repetition, an interlayer insulator may be interposed as a line/cell/line/interlayer-insulator/line/cell/line between cell array layers.

The memory cell array 1 may be divided into MAT of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 9:
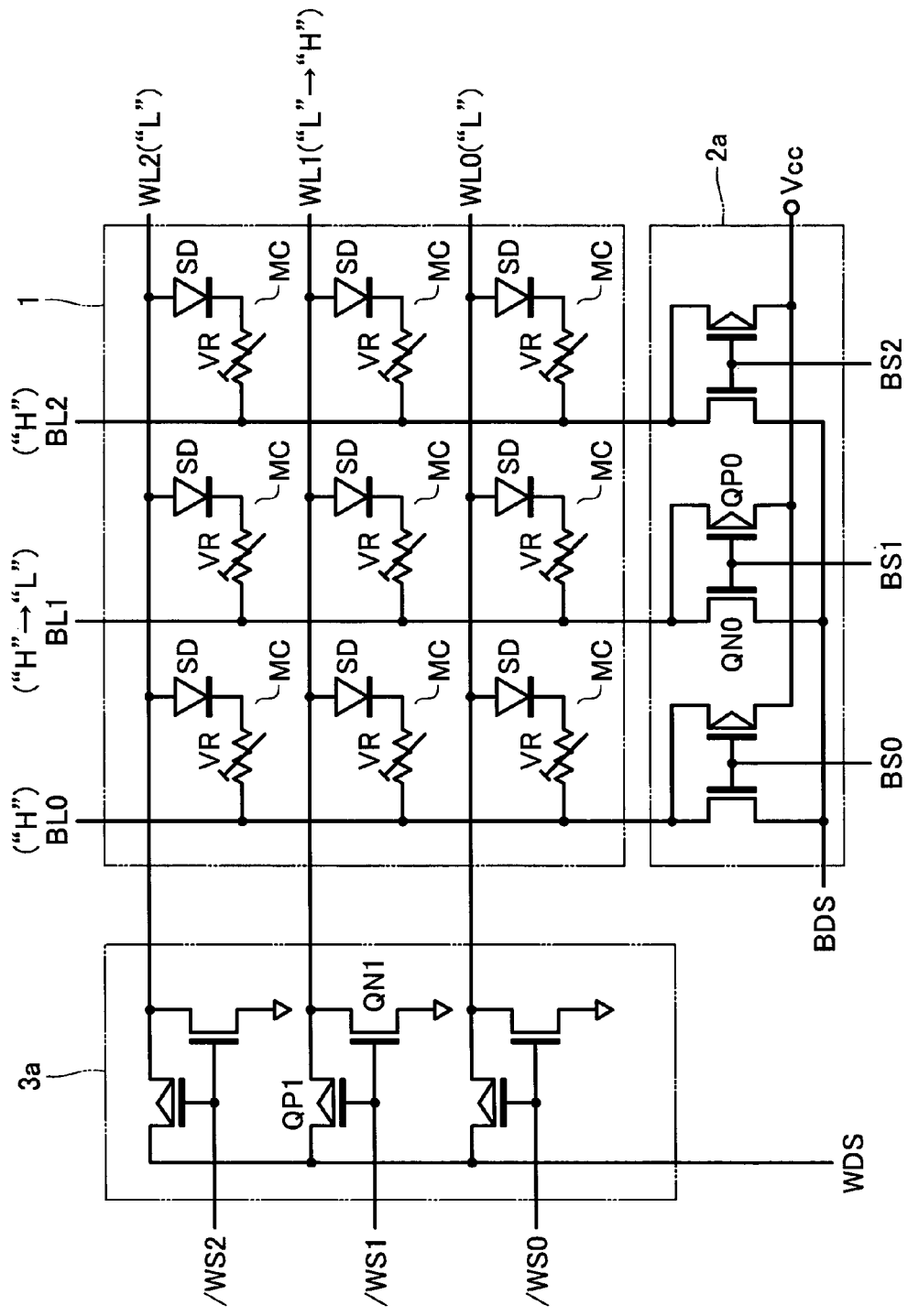
FIG. 9 is a circuit diagram of the memory cell array and peripheral circuits thereof according to the same embodiment.

FIG. 9 is circuit diagram of the memory cell array 1 using a diode SD as the non-ohmic element NO and peripheral circuits. For simplicity, the description advances on the assumption that the memory has a single-layered structure.

In FIG. 9, the diode contained in the memory cell MC has an anode connected to the word line WL and a cathode connected to the bit line BL via the variable resistor VR. Each bit line BL has one end connected to a selection circuit 2a, which is part of the column control circuit 2. Each word line WL has one end connected to a selection circuit 3a, which is part of the row control circuit 3.

The selection circuit 2a includes a selection PMOS transistor QP0 and a selection NMOS transistor QN0, provided at each bit line BL, of which gates and drains are commonly connected. The selection PMOS transistor QP0 has a source connected to a high potential source Vcc. The selection NMOS transistor QN0 has a source connected to a bit-line side drive sense line BDS, which is used to apply a write pulse and supply a detection current at the time of data read. The transistors QP0, QN0 have a common drain connected to the bit line BL, and a common gate supplied with a bit-line selection signal BSi.

The selection circuit 3a includes a selection PMOS transistor QP1 and a selection NMOS transistor QN1, provided at each word line WL, of which gates and drains are commonly connected. The selection PMOS transistor QP1 has a source connected to a word-line side drive sense line WDS, which is used to apply a write pulse and supply a detection current at the time of data read. The selection NMOS transistor QN1 has a source connected to the low potential source Vss. The transistors QP1, QN1 have a common drain connected to the word line WL and a common gate supplied with a word-line selection signal /WSi for selecting each word line WL.

[Binary Data Reading]

Prior to the description of multivalue data reading/writing, binary reading/writing is described next to facilitate understanding.

Figure 10:
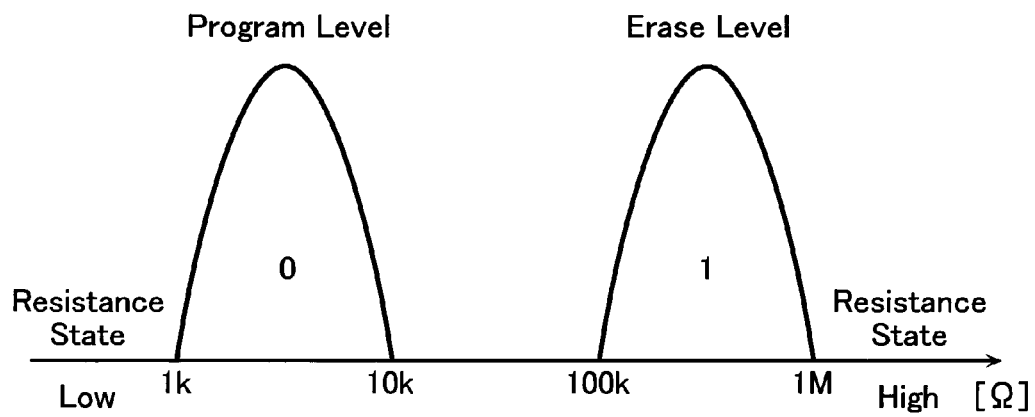
FIG. 10 is a graph showing resistance distributions and data in a memory cell in the case of binary data.

In the above-described circuits, data is stored in each memory cell MC as the resistance of the variable resistor VR. The word-line selection signals /WS0, /WS1, . . . are at "H" level and the bit-line selection signals BS0, BS1, . . . are at "L" level, for example, in the non-selected state. In this case, all word lines WL are set at "L" level and all bit lines BL at "H" level. In the non-selected state, diodes SD in all memory cells MC are reverse-biased and turned off and thus no current flows in the variable resistor VR. Selection of a middle memory cell MC linked to the word line WL1 and the bit line BL1 is considered herein. In this case, the row control circuit 3 sets the word-line selection signal /WS1 at "L" level and the column control circuit 2 sets the bit-line selection signal BS1 at "H" level. As a result, the word line WL1 is connected to the word-line side drive sense line WDS and the bit line BL1 is connected to the bit-line side drive sense line BDS. Accordingly, application of "H" level to the drive sense line WDS and "L" level to the drive sense line BDS results in the word line WL1 at "H" level and the bit line BL1 at "L" level. Thus, in the selected cell, the diode SD is forward-biased to allow current to flow. The amount of current flowing in the selected cell can be determined from the resistance of the variable resistor VR. Accordingly, by sensing the value of the current, the data can be read out. Namely, by relating the erased high-resistance state to "1" and the programmed low-resistance state to "0" as shown in FIG. 10, the sensed current can be detected as "1" for a small value and as "0" for a large value.

The selected word line WL1 and non-selected bit lines BL are at "H" level and accordingly no current flows in them. Non-selected word lines WL and the selected bit line BL1 are at "L" level and accordingly no current flows in them as well. Therefore, no current flows in other memory cells than the selected memory cell.

Figure 11:
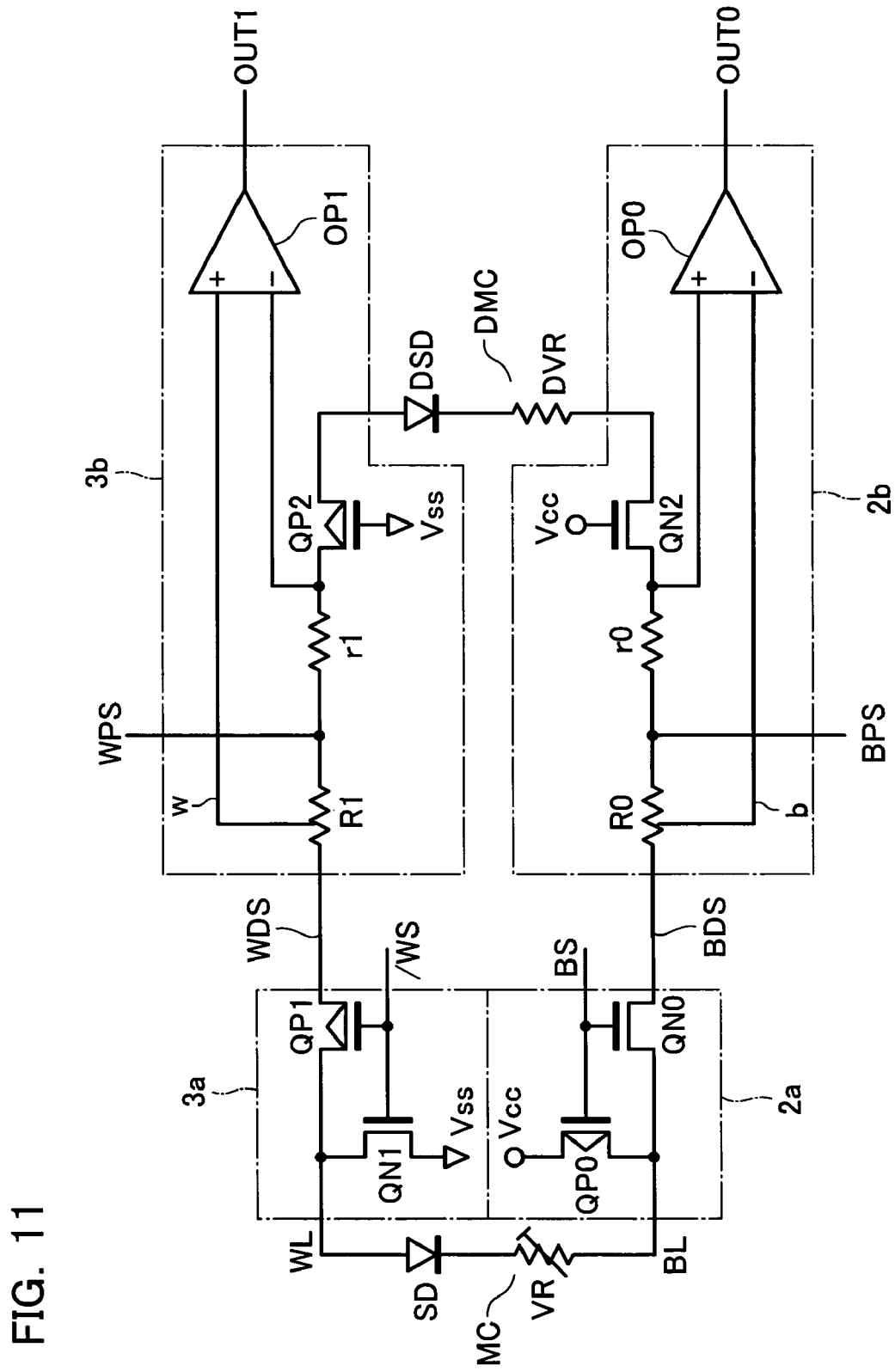
FIG. 11 is a circuit diagram showing a configuration of a sense amp in the same embodiment.

FIG. 11 shows a basic configuration of binary data sense amp circuits 2b, 3b applied to the above described cell array. These circuits are provided inside the column control circuit 2 and the row control circuit 3. This configuration is just shown as a preferred configuration example to be developed to a sense amp scheme when memory cell layers are arranged in multiple layers. Therefore, in the case of a single layer as in the present example, it is sufficient to provide either one of the sense amp circuits 2b, 3b.

The sense amp circuits 2b, 3b shown in FIG. 11 comprise sense amps of the current detection type, which include resistors R0, R1 serving as elements for converting the current flowing in a selected cell into a voltage, a dummy cell DMC, resistors r0, r1 for converting the current flowing in the dummy cell DMC into a voltage, and opamps OP0, OP1.

A word line WL in the cell array is selected by a selection PMOS transistor QP1 driven with a word line selection signal /WS or the output from the row control circuit 3. It is connected via the drive sense line WDS and via the resistor R1 to a high potential source line WPS. A bit line BL is selected by a selection NMOS transistor QN0 driven with a selection signal BS or the output from the column selection circuit 2. It is connected via the drive sense line BDS to a low potential source line BPS.

The dummy cell DMC equivalent to the memory cell MC includes a dummy diode DSD and a dummy resistor DVR and has a middle resistance between binary data resistances in the memory cell MC. The dummy cell DMC has one end connected via a selection PMOS transistor QP2 and via the resistor r1 to the high potential source line WPS. The PMOS transistor QP2 is a dummy element of the PMOS transistor QP1 and always driven on. The dummy cell DMC has the other end connected via an NMOS transistor QN2 and via the resistor r0 to the low potential source line BPS. The NMOS transistor QN2 is a dummy element of the selection NMOS transistor QN0 and always driven on.

The sense amp includes two opamps OP0, OP1 in the major part. The opamp OP0 has a non-inverting input terminal supplied with a voltage of the output b from the center tap of the resistor r0 and an inverting input terminal supplied with an appropriate voltage on a connection node between the resistor r0 and the NMOS transistor QN0. The opamp OP1 has an inverting input terminal supplied with an appropriate voltage of the output w from the center tap of the resistor r1 and a non-inverting input terminal supplied with a voltage on a connection node between the resistor r1 and the PMOS transistor QN2.

The following description is given to operation of the sense amp circuits 2b, 3b thus configured. As described above, in the non-selected state, the word line WL is kept at "L" level and the bit line BL at "H" level. At the time of selection, the word line selection signal /WS is set at "L" and the bit line selection signal BS at "H". When the high potential source line WPS is given "H" level=Vcc and the low potential source line BPS is given "L" level=Vss, cell current flows in the selected memory cell MC.

Specifically, the resistors R0, R1, r0, r1 may have the following relation. For example, the resistance of the resistor R0 to the terminal BPS from the center tap for providing the voltage output b to the opamp OP0 may be equal to the resistor r0. Similarly, the resistance of the resistor R1 to the terminal WPS from the center tap for providing the voltage output w to the opamp OP1 may be equal to the resistor r1. In such the case, if the selected cell is in the high-resistance state (hereinafter referred to as data "1") and the cell current is smaller than the current flowing in the dummy cell DMC, then the outputs from the opamps OP0, OP1 both become "H". In contrast, if the selected cell is in the low-resistance state (hereinafter referred to as data "0") and the larger cell current flows than the current flowing in the dummy cell DMC, then the outputs from the opamps OP0, OP1 both become "L". Thus, data "0", "1" can be distinguished from each other.

The configuration of the sense amp circuits 2b, 3b is just shown as a preferred configuration example to be developed to a sense amp scheme when memory cell layers are arranged in multiple layers. Therefore, if only the above-described binary storage is considered, it is sufficient to use only one of the opamps OP0, OP1. Alternatively, the relation between connections associated with the inverting input terminal and the non-inverting input terminal of one of the opamps OP0, OP1 may be reversed. In this case, the outputs from the two opamps OP0, OP1 may exhibit "H" for one and "L" for the other in accordance with data. Therefore, a further opamp that receives these two opamp outputs may be prepared to obtain a sense output of "H", "L" corresponding to data "0", "1".

[Binary Data Writing]

Binary data writing is described next.

Figure 12:
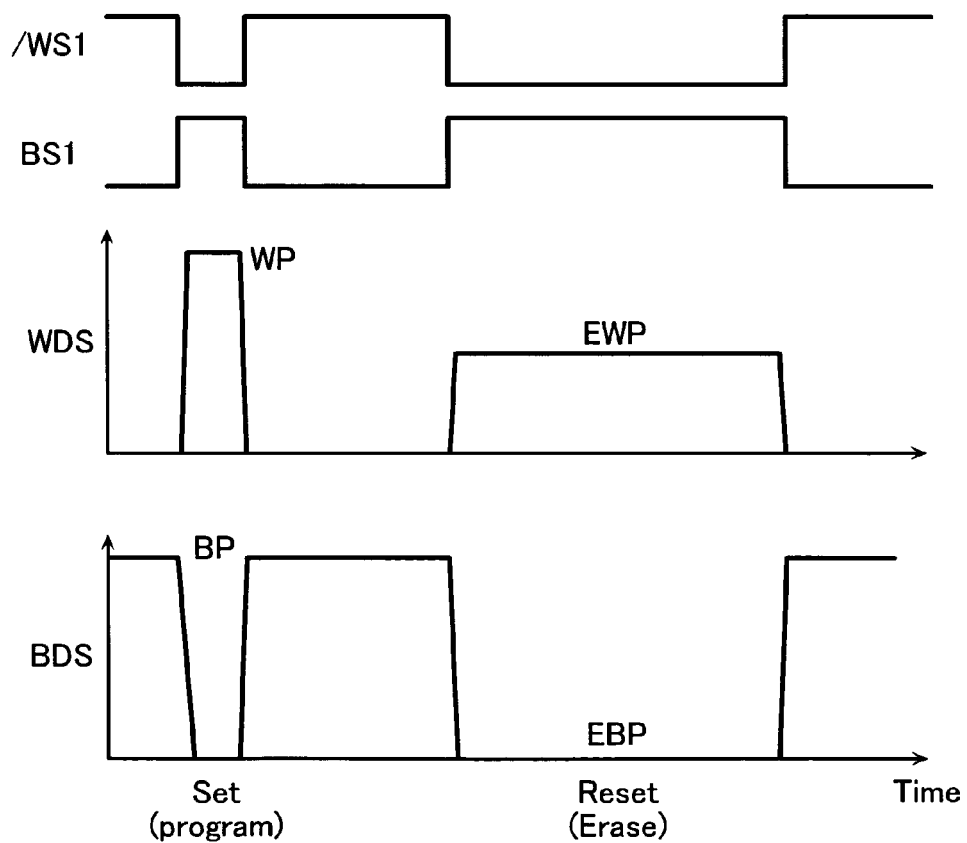
FIG. 12 is a waveform diagram showing selection signals /WS, BS and write pulses WP, BP at the time of data write.

FIG. 12 is a waveform diagram showing selection signals /WS, BS and write pulses WP, BP applied to drive data lines WDS, BDS at the time of data write. The write pulses WP, BP are generated from the pulse generator 9 that contains a booster circuit.

At the time of data set with a variation from the high-resistance state to the low-resistance state, the word line selection signal /WS1 for the word line WL1 corresponding to a data write target memory cell is set at "L" level. In addition, the bit line selection signal BS1 for the bit line BL1 corresponding to the write target memory cell is set at "H" level. At the same time, the word-line side drive sense line WDS is given a write pulse WP for varying the resistance of the variable resistor VR from the erase level to the program level as shown in FIG. 10. The write pulse WP is given from the pulse generator 9 shown in FIG. 1 and has a pulse height of, for example, Vcc level. At the same time, the bit-line side drive sense line BDS is given a negative write pulse BP of Vss level. As a result, the variable resistor VR in the high-resistance state (erased state) can be set in the low-resistance state (programmed state).

At the time of data reset with a variation from the low-resistance state to the high-resistance state, plural memory cells may be erased in batch though each memory cell may be erased individually. In this case, the word line selection signal /WS1 for the word line WL1 corresponding to a data erase target memory cell is kept at "L" level for a longer time than that at the time of set. In addition, the bit line selection signal BS1 for the bit line BL1 corresponding to the write target memory cell is kept at "H" level for a longer time than that at the time of set as well. At the time of erase, the memory cell is in the low-resistance state. Accordingly, the word-line side drive sense line WDS is given a lower erase pulse EWP than that at the time of set. In addition, the bit-line side drive sense line BDS is given a negative erase pulse EBP of Vss level. Thus, a larger current flowing in the variable resistor in the low-resistance state for a longer time causes Joule heat, which can reset the variable resistor to the high-resistance state.

[Multivalue Data Writing]

Multivalue data writing in the nonvolatile memory is described next.

Figure 13:
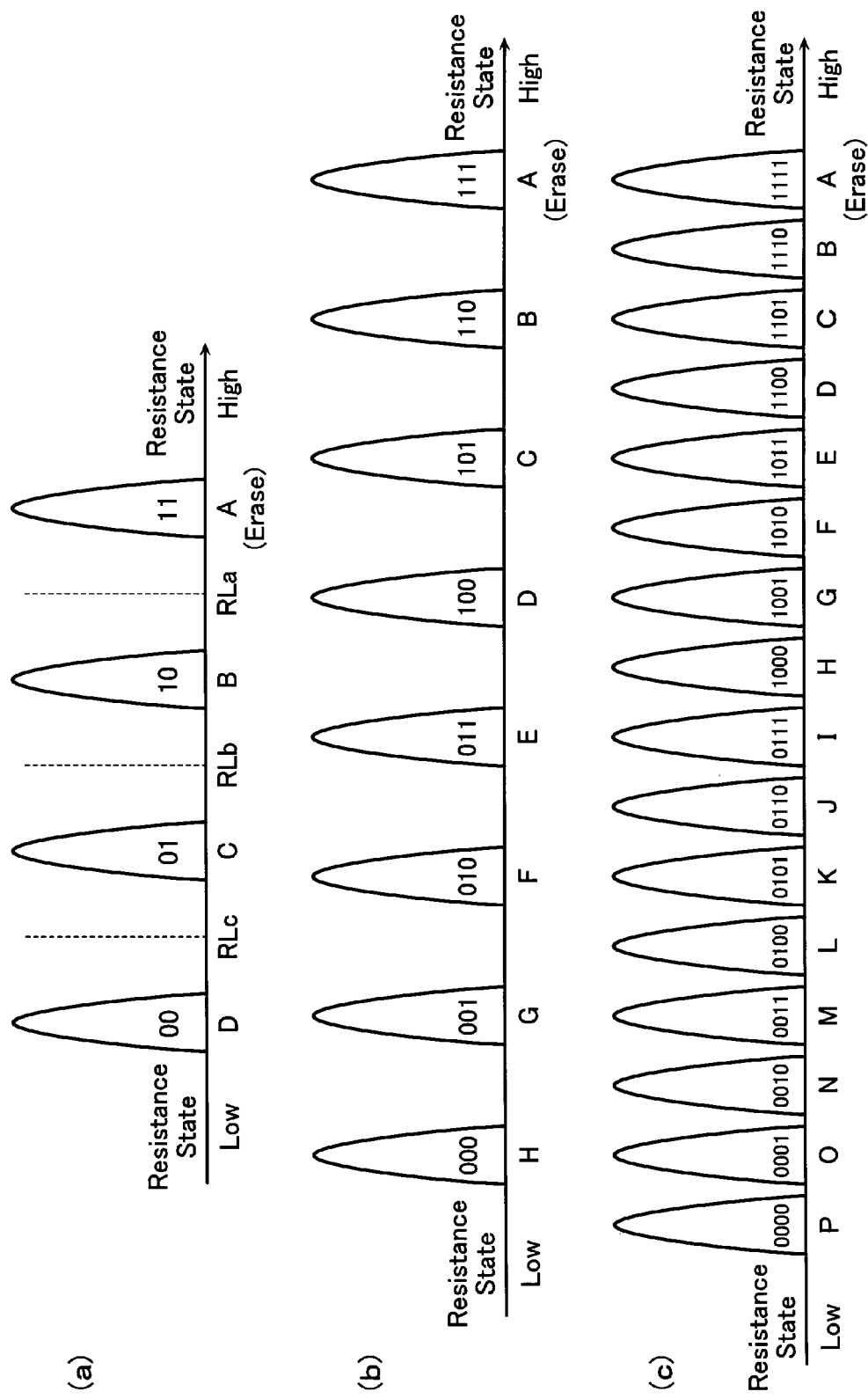
FIG. 13 provides graphs showing resistance distributions and data in a memory cell in the case of multivalue storage.

FIG. 13 provides graphs showing relations between resistance distributions and data in a memory cell in the case of multivalue storage. FIG. 13(a) shows an example of 2-bit data storage in each memory cell MC, in which write in each memory cell MC is executed as contained in 4 resistance distributions A-D. The distributions correspond to 2-bit data "11", "10", "01", "00" sequentially from the higher resistance distribution A. FIG. 13(b) shows an example of 3-bit data storage in each memory cell MC, in which write in each memory cell MC is executed as contained in 8 resistance distributions A-H. The distributions correspond to 3-bit data "111", "110", "101", "100", "011", "010", "001", "000" sequentially from the higher resistance distribution A. FIG. 13(c) shows an example of 4-bit data storage in each memory cell MC, in which write in each memory cell MC is executed as contained in 16 resistance distributions A-P. The distributions correspond to 4-bit data "1111", "1110", "1101", "1100", . . . , "0011", . . . , "0010", "0001", "0000" sequentially from the higher resistance distribution A.

In the case of multivalue data writing, write data is fed from the host into the data I/O buffer 4. It is considered in this case that data is fed on the basis of the number of storage bits of multivalue data per one cell. For example, in the case of 4-value storage per one cell, write data is fed from the host on a 2-bit basis. The data fed from the host is received at the data I/O buffer 4 and transferred to the encoder/decoder circuit 8. The input data may be decoded at the encoder/decoder circuit 8 and sent to the pulse generator 9. Alternatively, the input data from external may be sent to the pulse generator 9 as it is (in this case, the encoder/decoder circuit 8 is not required). The pulse generator 9 creates a write pulse WP for obtaining any one of the resistance levels A, B, C, D of FIG. 13. This pulse is transferred to the selected word line WL selected by the row selection circuit 3 at the write timing controlled by the state machine 7 and used in writing.

Figure 14:
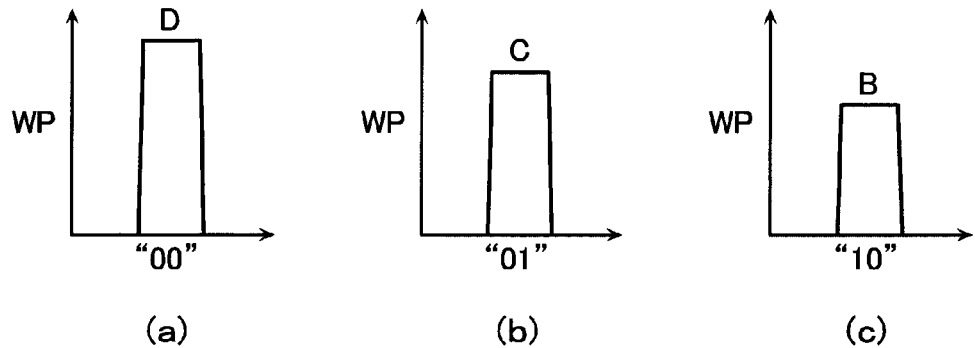
FIG. 14 is a waveform diagram showing a first generation example of write pulses in the same embodiment.

An example of write pulse formation in accordance with input data is shown in FIG. 14. This example is an example that varies the pulse voltage of the write pulse in accordance with input data. It is assumed that the erased state ("11") of the variable resistor VR shown herein is at A level. In this case, when input data is "00", then a write pulse WP having the highest pulse height (Vcc) is generated as shown in FIG. 14(a). When input data is "01", then a write pulse WP having a one-step lower height than the highest pulse height is generated as shown in FIG. 14(b). When input data is "10", then a write pulse WP having the lowest pulse height is generated as shown in FIG. 14(c). These write pulses WP are required to have voltages and pulse widths that can shift the resistance of the variable resistor VR to levels D, C, B shown in FIG. 13.

Figure 15:
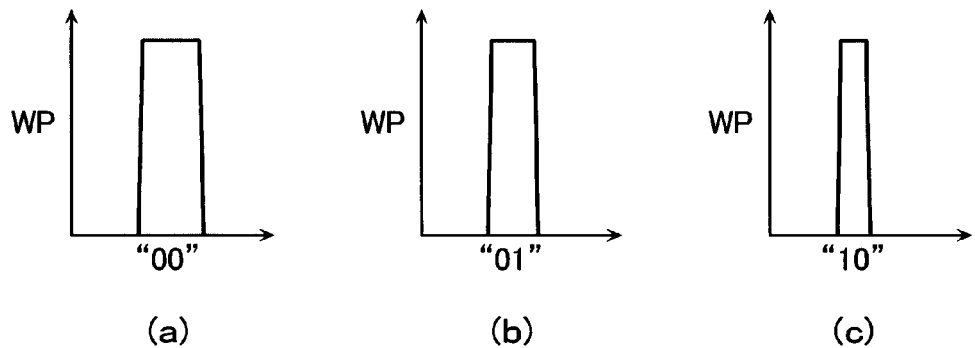
FIG. 15 is a waveform diagram showing a second generation example of write pulses in the same embodiment.

FIG. 15 shows another example of write pulse formation.

In this embodiment, input data is used to vary the pulse width of the write pulse. It is assumed that the erased state ("11") is at A level. In this case, when input data is "00", then a write pulse WP having the largest pulse width is generated as shown in FIG. 15(a). When input data is "01", then a write pulse WP having a one-step narrower pulse width than the largest pulse width is generated as shown in FIG. 15(b). When input data is "10", then a write pulse WP having the narrowest pulse width is generated as shown in FIG. 15(c). These write pulses WP are required to have voltages and pulse widths that can shift the resistance of the variable resistor VR to levels D, C, B shown in FIG. 13.

Figure 16:
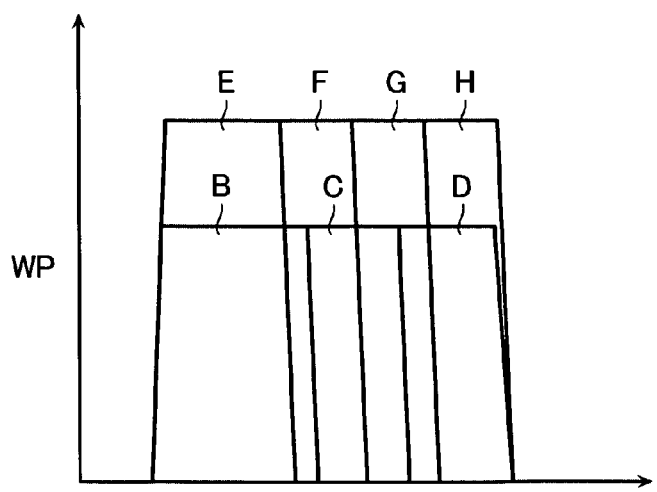
FIG. 16 is a waveform diagram showing a third generation example of write pulses in the same embodiment.

FIG. 16 shows an example of the octonary data write pulse WP, which can vary write power with the pulse width and the pulse height in combination. Namely, it is assumed that the erased state ("111") is at A level. In this case, when input data is "000", then a write pulse H having the largest pulse height and the widest pulse width is selected. When input data is "110", then a write pulse B having the smallest pulse height and the narrowest pulse width is selected.

Figure 17:
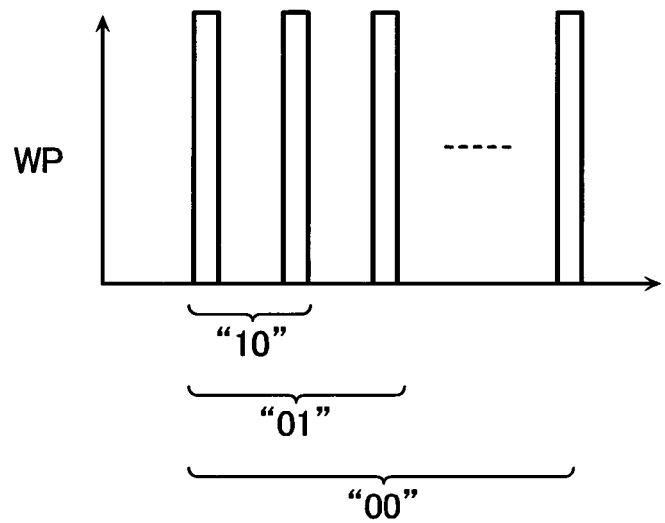
FIG. 17 is a waveform diagram showing a fourth generation example of write pulses in the same embodiment.

FIG. 17 is a waveform diagram showing write pulses for use in step-up or step-down write. In this case, the number of write pulses WP varies the resistance of the variable resistor VR. In execution of such the step-up or step-down write, the input of write data may be used to form the initial pulse, thereby reducing the write time. In addition to the number of pulses, the step width may be altered.

Figure 18:
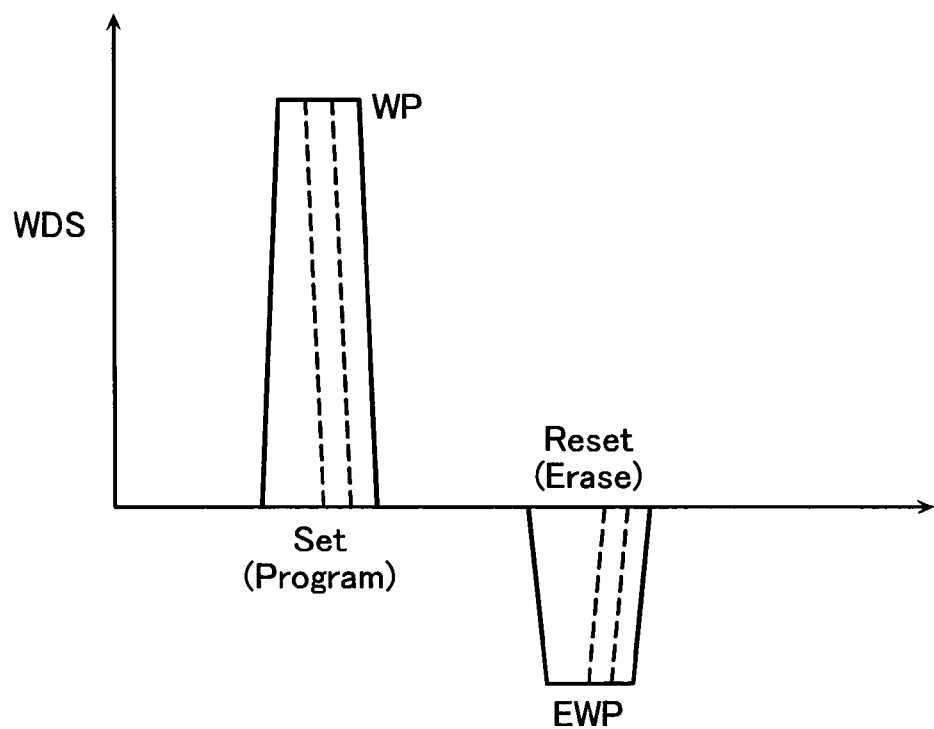
FIG. 18 is a waveform diagram showing a generation example of write and erase pulses in another embodiment.

The foregoing is described on the unipolar operation in which the write pulse and the erase pulse have an identical polarity. The invention is also applicable to a nonvolatile memory of the bipolar operation type. FIG. 18 shows an example in utilizing the asymmetric property of the non-ohmic element NO to apply a reverse-direction pulse to the variable resistor VR as the erase pulse EWP. The above-described variable resistor can be reset by application of a reverse-direction voltage as known. In this case, the write pulse WP may be changed in multiple stages and the pulse width or pulse height of the reverse-polarity erase pulse may be changed additionally to obtain an arbitrary resistance.

In the above example, when 2-bit data is stored in one memory cell, data is fed on a 2-bit basis. In this case, the input data is transferred to the pulse generator 9 to write 2 bits. This operation is repeated to execute serial write operation. At this time, addresses may be replaced for random access. If the input data of much more bits such as 8 bits is fed, the write operation may be executed sequentially on a 2-bit basis. In this case, the input data is first transferred to the column control circuit 2 and associated information is transferred before write to the pulse generator 9 to execute write and erase.

[Multivalue Data Reading]

Multivalue data reading is described next.

Figure 19:
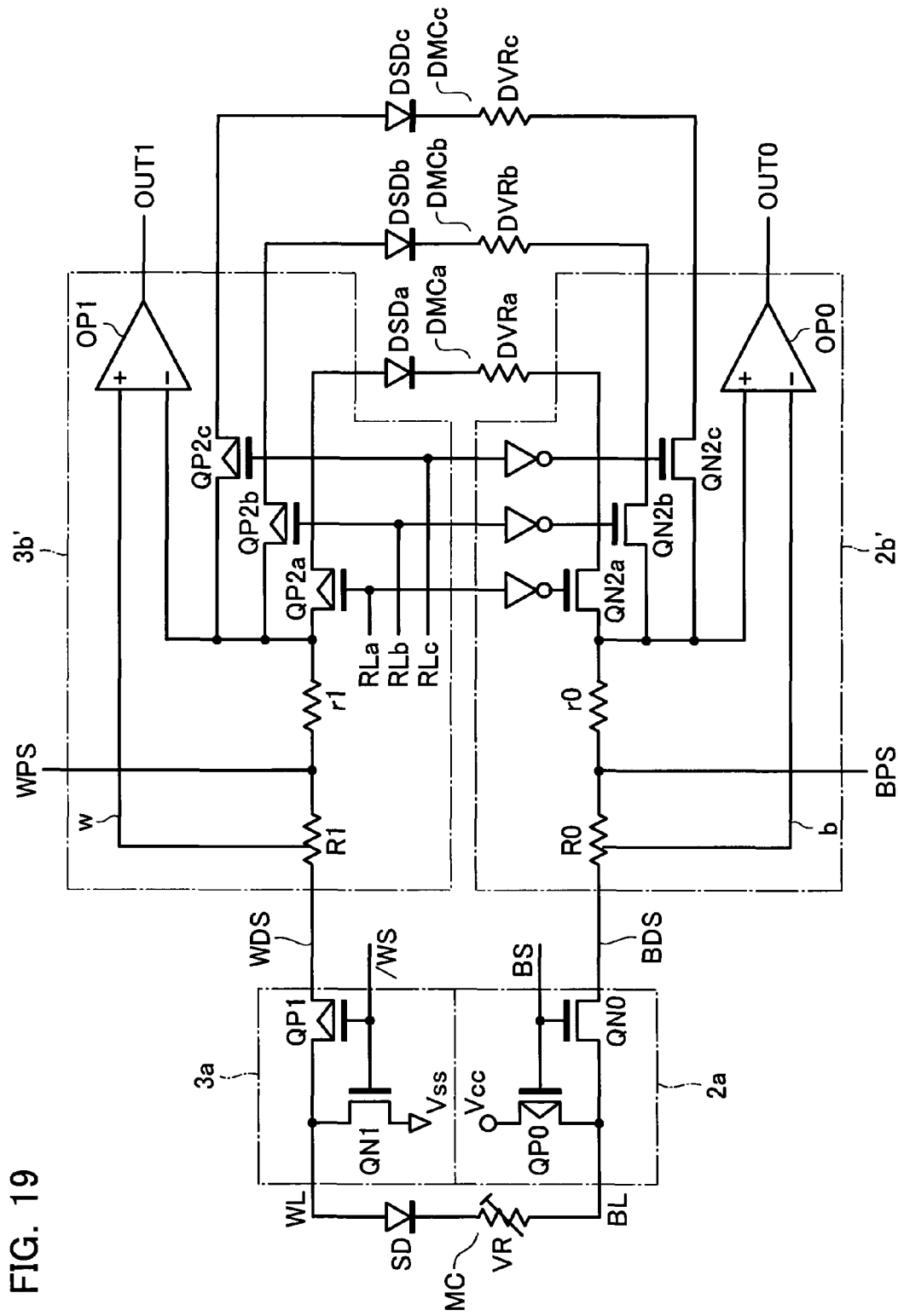
FIG. 19 is a circuit diagram showing a configuration of a sense amp for multivalue data detection in the same embodiment.

FIG. 19 is a circuit diagram showing a configuration of sense amp circuits 2', 3' for multivalue data. The circuit is configured to switch the dummy cells DMC operative to apply the reference voltage to the opamps OP0, OP1 among three dummy cells DMCa, DMCb, DMCc in accordance with the read level, different from the sense amp circuits 2, 3 for binary use shown in FIG. 11. The dummy cells DMCa-DMCc comprise respective serial circuits, which include dummies of the diode SD, or dummy diodes DSDa-DSDc, and dummy resistors DVRa-DVRc. Taking quaternary data read as an example, one memory cell MC may take 4 resistance distributions A-D as shown in FIG. 13(a). Accordingly, resistances RLa, RLb, RLc between the resistance distributions A-D are set as the resistances of the dummy resistors DVRa, DVRb, DVRc. Dummy PMOS transistors QP2a-QO2c and dummy NMOS transistors QN2a-QN2c also serve as selection transistors that select one of the dummy cells DMCa-DMCc.

Therefore, the resistance level of the memory cell MC can be detected by selecting among the read resistance levels RLa, RLb, RLc one by one to vary the reference resistance.

The read operation may also be applied to verify-read at the time of write by setting the read resistance level to the verify level.

The above circuit is an example to the last. It may be formed as a circuit operative to sense data by converting the value of current flowing in the memory cell MC into a charged voltage and determining the charged voltage at a clamp transistor of which threshold voltage is variable.

The above-described memory cell array is not particularly limited to the single-layered structure. If it is arranged in multiple layers, the data storage capacity can be increased additionally. In that case, even if part of word lines and bit lines are shared by an upper and a lower layer, detecting the value of current flowing in each line in consideration of the direction of current flow allows multivalue data to be read out.

The invention claimed is:

1. A nonvolatile semiconductor memory device, comprising:
   a memory cell array of electrically erasable programmable nonvolatile memory cells arranged in matrix, each memory cell using a variable resistor;
   a pulse generator operative to generate plural different types of write pulses for varying the resistance of said variable resistor in three or more stages based on ternary or higher write data; and
   a selection circuit operative to select a write target memory cell from said memory cell array based on a write address and supply said write pulse generated from said pulse generator to said selected memory cell,
   said pulse generator generating the different types of the write pulses each including a different number of unit pulses.

2. The nonvolatile semiconductor memory device according to claim 1, wherein said pulse generator generates plural types of write pulses different from each other further in at least one of pulse height and pulse width.

3. The nonvolatile semiconductor memory device according to claim 1, said memory cell includes a non-ohmic element serially connected to said variable resistor.

4. The nonvolatile semiconductor memory device according to claim 3, wherein said non-ohmic element comprises a diode.

5. The nonvolatile semiconductor memory device according to claim 1, wherein said pulse generator generates an erase pulse for erasing data in a memory cell,
   wherein said write pulses have a different polarity from the polarity of said erase pulse.

6. The nonvolatile semiconductor memory device according to claim 1, wherein said pulse generator generates an erase pulse for erasing data in a memory cell,
   wherein said write pulses and said erase pulse have an identical polarity.

7. The nonvolatile semiconductor memory device according to claim 1, further comprising:
   a plurality of dummy resistors each serving as the standard for the read resistance level of said variable resistor; and
   a sense amplifier circuit operative to compare the resistance of a certain one of said dummy resistors with the resistance of said variable resistor in said selected memory cell and provide a comparison result,
   wherein data reading comprises sequentially selecting said dummy resistors to vary the resistance serving as the standard to detect the resistance level of said selected memory cells.

8. The nonvolatile semiconductor memory device according to claim 7, wherein said data reading comprises verifying in data writing.

9. A nonvolatile semiconductor memory device, comprising:
   a memory cell array formed in plural stacked layers, each layer including a plurality of word lines, a plurality of bit lines crossing said word lines, and memory cells arranged at intersections of said word lines and said bit lines, said memory cells including electrically erasable programmable nonvolatile memory cells arranged in a matrix, each memory cell using a variable resistor;
   a pulse generator operative to generate plural different types of write pulses for varying the resistance of said variable resistor in three or more stages based on ternary or higher write data; and
   a selection circuit operative to select a write target memory cell from said memory cell array based on a write address and supply said write pulse generated from said pulse generator to said selected memory cell,
   said pulse generator generating the different types of the write pulses each including a different number of unit pulses.

10. The nonvolatile semiconductor memory device according to claim 9, wherein said word lines or said bit lines, are shared by two adjacent layers in said memory cell array.

11. The nonvolatile semiconductor memory device according to claim 9, wherein said pulse generator generates plural types of write pulses different from each other further in at least one of pulse height and pulse width.

12. The nonvolatile semiconductor memory device according to claim 9, said memory cell includes a non-ohmic element serially connected to said variable resistor.

13. The nonvolatile semiconductor memory device according to claim 12, wherein said non-ohmic element comprises a diode.

14. A nonvolatile semiconductor memory device, comprising:
   a memory cell array of electrically erasable programmable nonvolatile memory cells arranged in matrix, each memory cell using a variable resistor;
   a decoder circuit operative to generate ternary or higher write data to be written in a certain one of said memory cells based on input data to be written in said memory cell array; and
   a pulse generator operative to generate plural different types of write pulses for varying the resistance of said variable resistor in three or more stages based on said write data
   said pulse generator generating the different types of said write pulses each including a different number of unit pulses.

15. The nonvolatile semiconductor memory device according to claim 14, wherein said pulse generator generates plural types of write pulses different from each other further in at least one of pulse height and pulse width.

16. The nonvolatile semiconductor memory device according to claim 14, said memory cell includes a non-ohmic element serially connected to said variable resistor.

17. The nonvolatile semiconductor memory device according to claim 16, wherein said non-ohmic element comprises a diode.

* * * * *